US006987289B2

(12) United States Patent
Nowak

(10) Patent No.: US 6,987,289 B2
(45) Date of Patent: Jan. 17, 2006

(54) HIGH-DENSITY FINFET INTEGRATION SCHEME

(75) Inventor: Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/984,578

(22) Filed: Nov. 9, 2004

(65) Prior Publication Data

US 2005/0082578 A1 Apr. 21, 2005

Related U.S. Application Data

(62) Division of application No. 10/604,077, filed on Jun. 25, 2003.

(51) Int. Cl.
*H01L 21/00* (2006.01)
*H01L 21/84* (2006.01)

(52) U.S. Cl. .............. 257/154; 438/142; 438/157; 438/167; 438/186; 438/197; 438/578; 438/669

(58) Field of Classification Search ............. 438/142, 438/154, 157, 167, 186, 197, 578, 669
See application file for complete search history.

(56) References Cited

U.S. PATENT DOCUMENTS

| 4,996,574 | A | | 2/1991 | Shirasaki | 257/66 |
|---|---|---|---|---|---|
| 5,391,506 | A | | 2/1995 | Tada et al. | 438/268 |
| 6,355,532 | B1 | | 3/2002 | Seliskar et al. | 438/283 |
| 6,413,802 | B1 | | 7/2002 | Hu et al. | 438/151 |
| 6,432,829 | B2 | | 8/2002 | Muller et al. | 438/694 |
| 6,433,609 | B1 | | 8/2002 | Voldman | 327/313 |
| 6,525,403 | B2 | | 2/2003 | Inaba et al. | 257/618 |
| 6,664,582 | B2 | * | 12/2003 | Fried et al. | 257/308 |
| 6,706,571 | B1 | * | 3/2004 | Yu et al. | 438/157 |
| 2003/0178670 | A1 | | 9/2003 | Fried et al. | 257/319 |
| 2003/0201458 | A1 | | 10/2003 | Clark et al. | 257/192 |
| 2004/0026736 | A1 | | 2/2004 | Grupp et al. | 257/330 |
| 2004/0048424 | A1 | * | 3/2004 | Wu et al. | 438/154 |
| 2004/0110331 | A1 | * | 6/2004 | Yeo et al. | 438/199 |
| 2004/0222477 | A1 | * | 11/2004 | Aller et al. | 257/412 |

* cited by examiner

*Primary Examiner*—Amir Zarabian
*Assistant Examiner*—Ida M. Soward
(74) *Attorney, Agent, or Firm*—McGinn & Gibb, PLLC; William D. Sabo, Esq.

(57) ABSTRACT

The invention provides a method of manufacturing a fin-type field effect transistor (FinFET) that forms a unique FinFET that has a first fin with a central channel region and source and drain regions adjacent the channel region, a gate intersecting the first fin and covering the channel region, and a second fin having only a channel region.

14 Claims, 6 Drawing Sheets

HIGH-DENSITY FINFET INTEGRATION SCHEME

CROSS REFERENCE TO RELATED APPLICATIONS

This application is a division of U.S. application Ser. No. 10/604,077 filed Jun. 25, 2003.

BACKGROUND OF INVENTION

1. Field of the Invention

The present invention generally relates to transistors and more particularly to the fin type transistors known as Fin-FETs and to an improved manufacturing process and Fin-FET structure.

2. Description of the Related Art

As the need to decrease the size of transistors continues, new and smaller types of transistors are created. One recent advance in transistor technology is the introduction of fin type field effect transistors that are known as FinFETs. U.S. Pat. No. 6,413,802 to Hu et al. (hereinafter "Hu"), which is incorporated herein by reference, discloses a FinFET structure that includes a center fin that has a channel along its center and source and drains at the ends of the fin structure. A gate conductor covers the channel portion.

While FinFETs structures reduce the size of transistor-based devices, it is still important to continue to reduce the size of FinFETs transistors. The invention described below provides a method and structure which decreases the distance between adjacent FinFETs, thereby reducing the overall size of the transistor-based structure.

SUMMARY OF INVENTION

The invention provides a method of manufacturing a fin-type field effect transistor (FinFET) that begins by patterning a rectangular sacrificial mandrel on a substrate. Next, the invention forms mask sidewalls along the vertical surfaces of the mandrel. Subsequently, the mandrel is removed and the portions of the semiconductor layer not protected by the mask sidewalls are etched to leave a freestanding rectangular loop of semiconductor material having two longer fins and two shorter sections. The process continues by patterning a rectangular gate conductor over central sections of the two longer fins, wherein the gate conductor intersects to the two longer fins. Next, the invention dopes portions of the semiconductor material not covered by the gate conductor to form source and drain regions in portions of the fins that extend beyond the gate. Following this, the invention forms insulating sidewalls along the gate conductor.

Then, the invention covers the gate conductor and the semiconductor material with a conductive contact material and forms a contact mask over a portion of the conductive contact material that is above source and drain regions of a first fin of the two longer fins. The invention follows this by selectively etching regions of the conductive contact material and the semiconductor material not protected by the contact mask. This leaves the conductive contact material on source and drain regions of the first fin and removes source and drain regions of a second fin of the two longer fins.

This process forms a unique FinFET that has a first fin with a central channel region and source and drain regions adjacent the central region, a gate structure intersecting the first fin and covering the channel region, and a second fin having only a channel region. The second fin is parallel to the first fin and covered by the gate.

In this unique structure, the second fin has a length equal to the width of the gate structure and the first fin is longer than the second fin. The source and drain regions of the first fin extend beyond the gate structure; however, the second fin does not extend beyond the gate. The source and drain contacts only cover the source and drain regions of the first fin and no contacts are positioned adjacent the second fin.

BRIEF DESCRIPTION OF DRAWINGS

The foregoing and other objects, aspects and advantages will be better understood from the following detailed description of a preferred embodiment(s) of the invention with reference to the drawings, in which.

DETAILED DESCRIPTION

Since the silicon fins in FinFETs are significantly thinner than the gate length, non-conventional means of defining the fin thickness are useful. The invention uses a Sidewall Image Transfer (SIT) process for the purpose of forming the fins. Since all shapes left on the wafer from SIT processing are in the form of loops, a trim mask (TR) is necessary to remove unwanted fins shapes that are formed during sidewall image transfer processing. Trim masks break the loops into lines with ends. The trim mask requires critical image tolerance and placement. Therefore, the trim mask is costly and can decrease yield. Furthermore, the trim mask adds requirements to other overlays since the trimmed fins are second-order alignments to later masks. The invention described below eliminates the need to use such a trim mask.

Figure 1A:
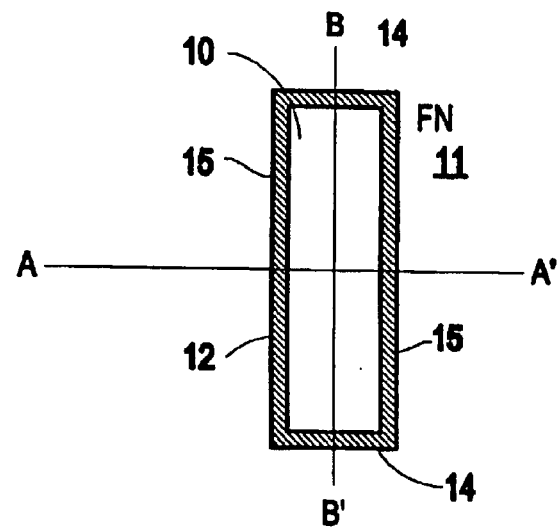
FIG. 1A is a schematic top-view diagram of a partially completed FinFET structure according to the invention.
Figure 1B:
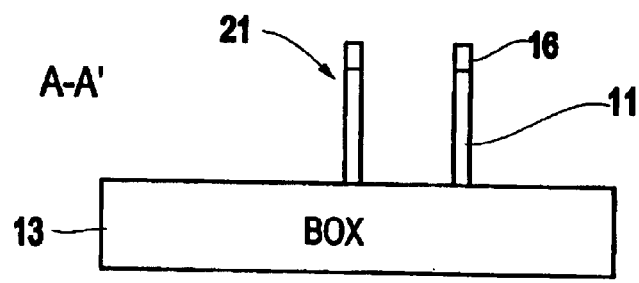
FIG. 1B is a cross-sectional view along line A–A' in FIG. 1A.

As mentioned above, the invention forms fins for a FinFET device using sidewall image transfer processing, yet the invention eliminates the need for a separate trim mask. Instead, the invention trims the unwanted portions of the loop structure formed during the sidewall image transfer processing using the same mask that defines the source and drain contacts. The inventive methodology begins by patterning a rectangular sacrificial mandrel 10 on a hard-mask layer 16 that overlies a layer of semiconductor material 11 on a buried oxide (BOX) 13, as shown in FIGS. 1A and 1B. Next, the invention forms sidewall spacers 12 along the vertical surfaces of the mandrel 10. The sidewall spacers 12 are formed by depositing a masking material and then performing a selective anisotropic etching process that removes material from horizontal surfaces at substantially higher rates than it removes material from vertical surfaces. This process leaves the deposited mask material 12 only along the sides of the mandrel 10, as shown in FIGS. 1A. Subsequently, the mandrel 10 is removed, the hard-mask material 16 is etched using the spacers 12 as masks, and the spacers 12 are removed to leave a freestanding rectangular loop of mask material 16 having two longer sections 15 and two shorter sections 14.

Figure 1C:
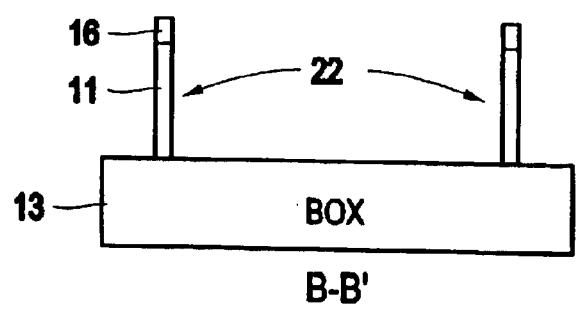
FIG. 1C is a cross-sectional view along line B–B' in FIG. 1A.

An etching process is used to remove portions of the underlying semiconductor material 11 not protected by the mask 16. This leaves a freestanding rectangular loop of semiconductor material 11 covered by the mask material 16 as most clearly shown in FIGS. 1B and 1C. FIG. 1A is a top-view of the structure, FIG. 1B is a cross-sectional view along line A–A' in FIG. 1A, and FIG. 1C is a cross-sectional view along line B–B' in FIG. 1A. The longer fins 21 of semiconductor material 11 are perpendicular to the shorter sections 22 of the semiconductor material 11.

Figure 2A:
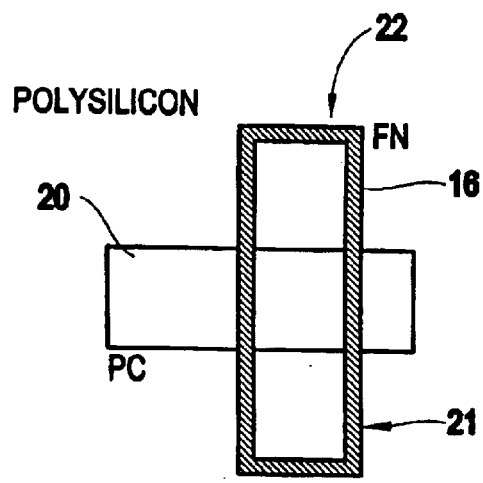
FIG. 2A is a schematic top-view diagram of a partially completed FinFET structure according to the invention.
Figure 2B:
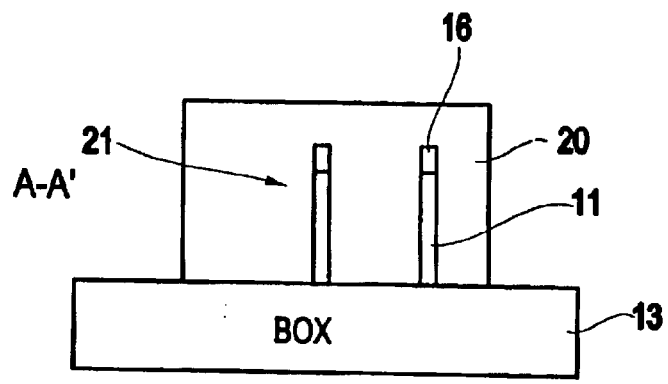
FIG. 2B is a cross-sectional view along line A–A' in FIG. 2A.
Figure 2C:
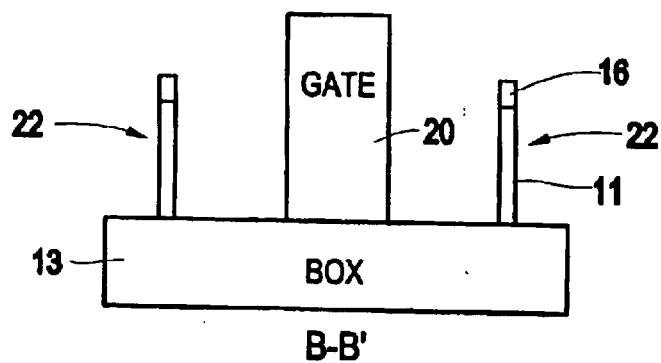
FIG. 2C is a cross-sectional view along line B–B' in FIG. 2A.

The process continues by patterning a rectangular gate conductor 20 over central sections of the two longer fins 21, wherein the gate conductor 20 intersects the two longer fins 21, as shown in FIGS. 2A–2C. Next, the invention dopes portions of the semiconductor loop 11 not covered by the gate conductor 20 to form conductive source and drain regions in portions of the longer fins 21 that extend beyond the gate 20. Following this, the invention forms insulating sidewalls 31 along the gate conductor 20, as shown in FIG. 3C. The spacers 31 and gate 20 are sometimes referred to herein as a gate structure.

Figure 3A:
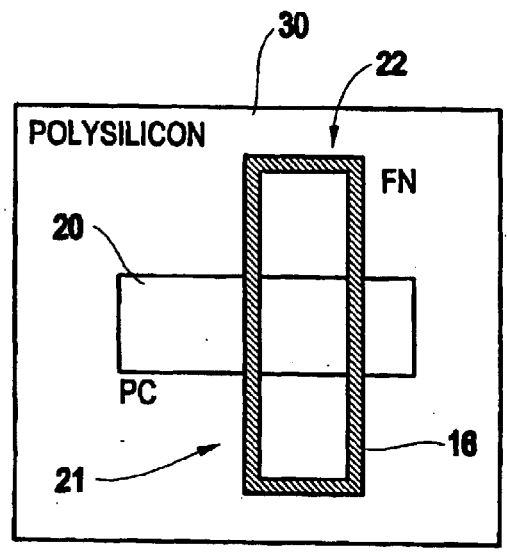
FIG. 3A is a schematic top-view diagram of a partially completed FinFET structure according to the invention.
Figure 3B:
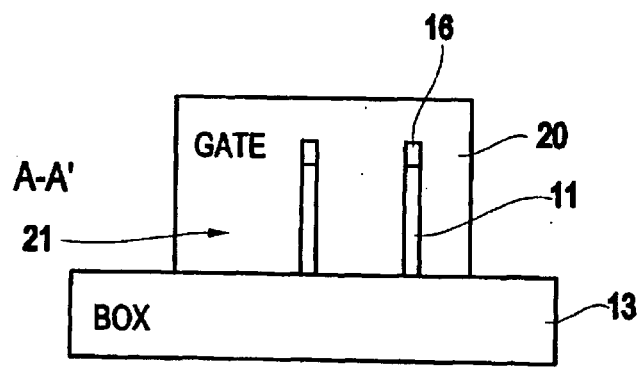
FIG. 3B is a cross-sectional view along line A–A' in FIG. 3A.
Figure 3C:
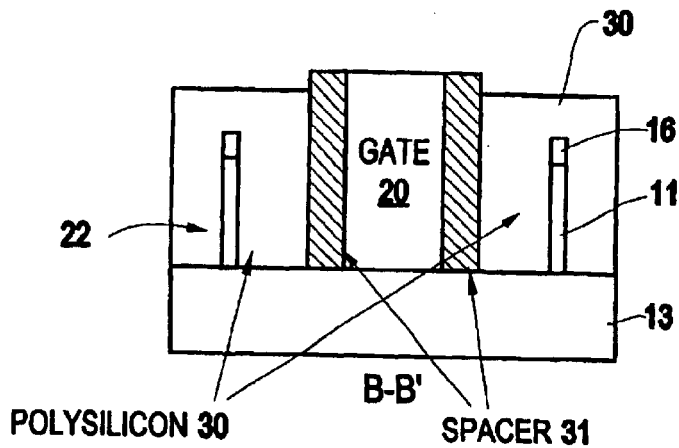
FIG. 3C is a cross-sectional view along line B–B' in FIG. 3A.

Then, the invention covers the gate conductor 20 and the semiconductor material 11 with a conductive contact material 30 (such as polysilicon) as shown in FIGS. 3A–3C. As most clearly shown in FIGS. 3B and 3C, the conductive material 30 completely covers the fin structures 11, yet has a height less than that of the gate 20 and spacers 31. The conductive material 30 should not cover the gate 20, otherwise the gate 20 may be shorted to the source and drain contacts. The conductive material 30 can either be selectively deposited so as not to exceed the height of the gate 20 or can be subsequently recessed below the height of the gate 20 using well known etching or overpolishing processes.

Figure 4C:
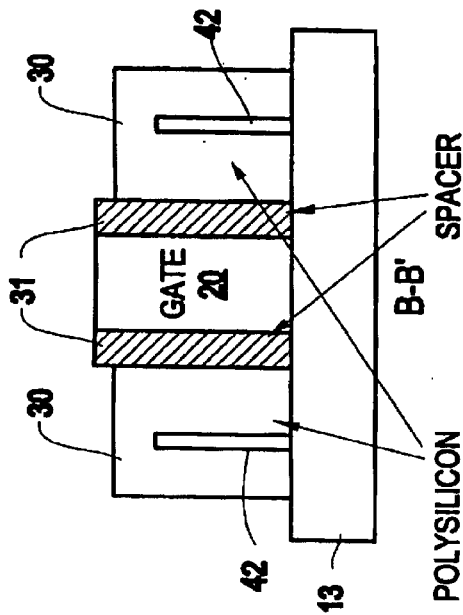
FIG. 4C is a cross-sectional view along line B–B' in FIG. 4A.
Figure 4D:
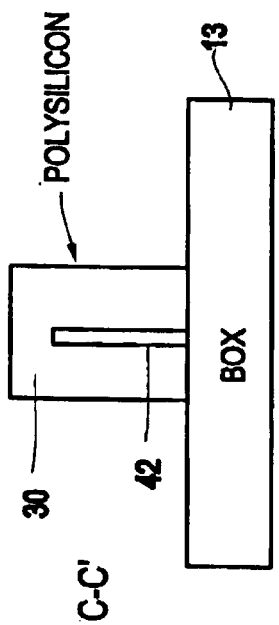
FIG. 4D is a cross-sectional view along line C–C' in FIG. 4A.
Figure 4A:
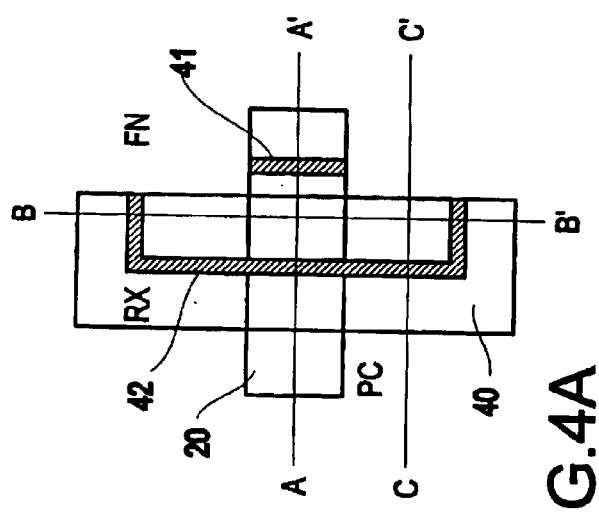
FIG. 4A is a schematic top-view diagram of a partially completed FinFET structure according to the invention.

Next, as shown FIG. 4A, the invention forms a contact mask 40 over a portion of the conductive contact material 30 that is above source and drain regions of a first fin 42 of the two longer fins 21. The invention follows this by selectively etching regions of the conductive contact material 30 and the semiconductor material 11 that are not protected by the contact mask. Such an etch will not affect the gate 20 or spacers 31. This leaves the conductive contact material 30 only on the source and drain regions of the first fin 42 and removes source and drain regions of a second fin 41 of the two longer fins 21. Therefore, the contact mask 40 performs two functions by patterning the source and drain contacts and by trimming the unwanted portion of the semiconductor material 11. By utilizing the contact mask 40 in this manner, the invention avoids the need for a separate trim mask.

Figure 4B:
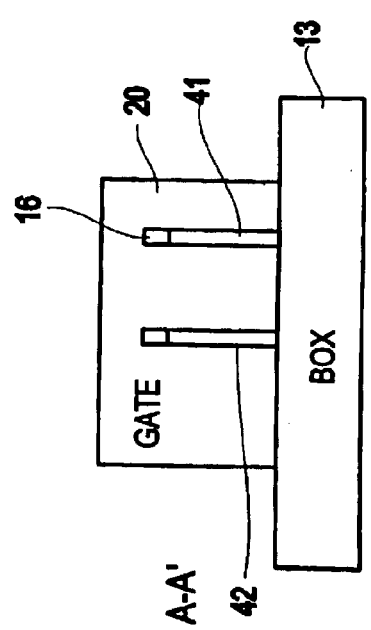
FIG. 4B is a cross-sectional view along line A–A' in FIG. 4A.
Figure 5A:
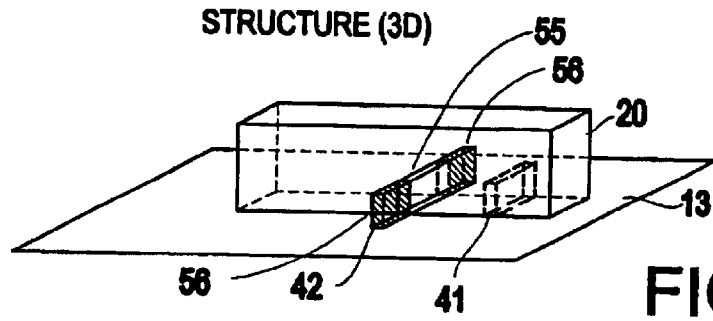
FIG. 5A is a schematic perspective view illustrating the inventive fins intersecting the gate.
Figure 5B:
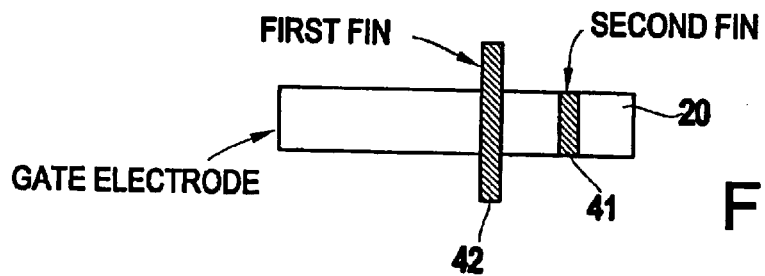
FIG. 5B is a schematic top-view diagram of the structure shown in FIG. 5A.

FIG. 4B is a cross-sectional view along line A–A' in FIG. 4A, FIG. 4C is a cross-sectional view along line B–B' in FIG. 4A, and FIG. 4D is a cross-sectional view along line C–C' in FIG. 4A. In addition, FIG. 5A is a schematic perspective view illustrating the inventive fins 41, 42 intersecting the gate 20, and FIG. 5B is a schematic top-view diagram of the structure shown in FIG. 5A. These additional views illustrate that the inventive structure produced is a unique FinFET that has a first fin 42 with a central channel region 55 and source and drain regions 56 adjacent the channel region 55. The gate 20 intersects the first fin 42 and covers the channel region 55. The second fin 41 only has a channel region. The second fin 41 is parallel to the first fin 42 and is covered by the gate structure.

In this unique structure, the second fin 41 has a length equal to the width of the gate structure and the first fin 42 is longer than the second fin 41. The source and drain regions 56 of the first fin 42 extend beyond the gate structure; however, the second fin 41 does not extend beyond the gate structure because that portion of the second fin 41 was trimmed when the source and drain contacts 30 were patterned. The source and drain contacts 30 only cover the source and drain regions 56 of the first fin 42 and no contacts are positioned adjacent the second fin 41.

Figures 6A, 6B:
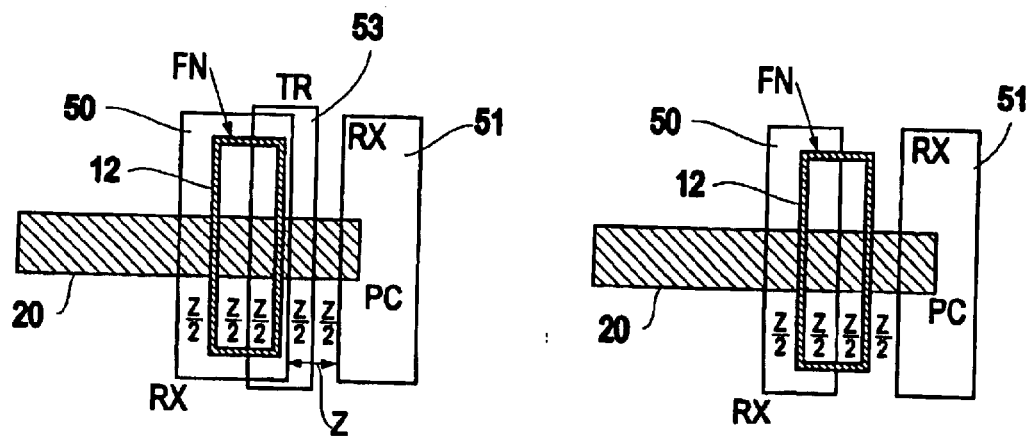
FIG. 6A is a schematic top-view diagram illustrating the spacing that is required when a conventional trim mask is utilized.
FIG. 6B is a schematic top-view diagram illustrating the spacing that can be achieved with the invention when the use of a trim mask is avoided.

FIG. 6A is a schematic top-view diagram illustrating the spacing that is required when a trim mask 53 is utilized and FIG. 6B is a schematic top-view diagram illustrating the spacing that can be achieved with the invention when the use of a trim mask is avoided. As shown in FIG. 6A, at least one unit of spacing "Z" is created to accommodate for the trim mask 53. In this example half a unit (Z/2) is provided between the trim mask 53 and the adjacent silicon island mask RX (51) and the trim mask itself extends over half a unit (Z/2) beyond the edge of the silicon island mask RX (50) with which the trim mask 53 is associated. To the contrary, as shown in FIG. 6B, since no trim mask is used with the invention, the adjacent silicon island mask 51 can be placed within a half unit (Z/2) of the edge of the semiconductor loop 11 (or one unit of spacing (Z) from the adjacent silicon island mask 50). Since the RX size is decreased, a lower parasitic capacitance from the contact region is obtained. A denser layout with simpler layout rules and decreased process cost results.

Figure 7:
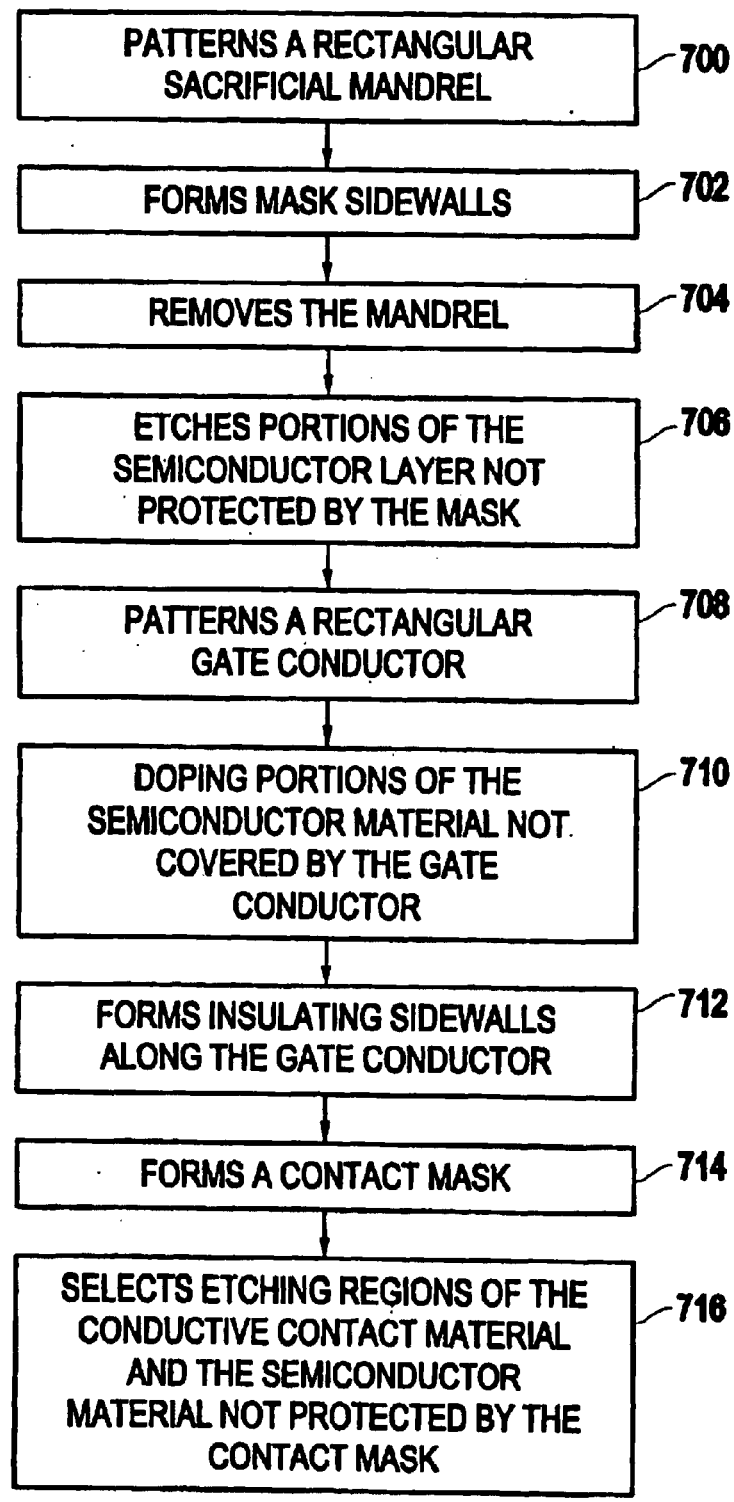
FIG. 7 is a flow diagram illustrating a preferred method of the invention.

FIG. 7 is a flow diagram illustrating a preferred method of the invention. More specifically, the method patterns a rectangular sacrificial mandrel 700 on a semiconductor layer, forms mask sidewalls 702 along the vertical surfaces of the mandrel, removes the mandrel 704, and etches portions of the hard-mask not protected by the sidewalls. After removal of the mask sidewalls, the invention etches portions of the semiconductor layer not protected by the hard-mask 706 to leave a freestanding rectangular loop of semiconductor material having two longer fins and two shorter sections. The invention patterns a rectangular gate conductor 708 over central sections of the two longer fins. The invention dopes portions 710 of the semiconductor material, not covered by the gate conductor, to form source and drain regions in portions of the fins that extend beyond the gate. Next the invention forms insulating sidewalls 712 along the gate conductor and covers the gate conductor and the semiconductor material with a conductive contact material. The conductive material is planarized or etched back until the gate conductor is exposed. Then, the invention forms a contact mask 714 over a portion of the conductive contact material that is above source and drain regions of a first fin of the two longer fins and selectively etches 716 regions of the conductive contact material and the semiconductor material not protected by the contact mask. The selective etching process 716 leaves the conductive contact material on the source and drain regions of the first fin and removes the source and drain regions of a second fin of the two longer fins.

Therefore, as shown above, only one mask is added to a conventional CMOS design, namely the "FN" level mask, which is used to define a mandrel 10 about which spacers are formed. The conventional silicon-island mask (RX) is used after the gate lithography and processing (PC) to both define source/drain regions outside the gate and to trim fins that are not desired for the circuit. This eliminates a "trim" mask (TR) and associated processing. This also eliminates some density loss due to the second-order alignment of RX to TR (both levels normally align to FN) and hence yields a denser design.

Since the RX size is decreased, a lower parasitic capacitance from the contact region is obtained. A denser layout follows with the small RX size, which in turn results in circuits that reside closer to one another. This translates to shorter interconnections and thus lower wire resistance and capacitance. The end result is lower cost, lower power and faster circuits.

While the invention has been described in terms of preferred embodiments, those skilled in the art will recognize that the invention can be practiced with modification within the spirit and scope of the appended claims.

What is claimed is:

1. A method of manufacturing a fin-type field effect transistor (FinFET), said method comprising:
   patterning a rectangular sacrificial mandrel on a hard-mask overlying a semiconductor layer;
   forming sidewalls along the vertical surfaces of said mandrel;
   removing said mandrel;
   etching portions of said hard-mask not protected by said sidewalls;
   removing said sidewalls;
   etching portions of said semiconductor layer not protected by said hard-mask sidewalls to leave a freestanding rectangular loop of semiconductor material having two longer fins and two shorter sections, wherein said longer fins are perpendicular to said shorter sections;
   patterning a rectangular gate conductor over central sections of said two longer fins, wherein said gate conductor intersects to said two longer fins;
   doping portions of said semiconductor material not covered by said gate conductor to form source and drain regions in portions of said fins that extend beyond said gate;
   forming insulating sidewalls along said gate conductor comprising a gate structure;
   covering said gate conductor and said semiconductor material with a conductive contact material;
   forming a contact mask over a portion of said conductive contact material that is above source and drain regions of a first fin of said two longer fins; and
   selectively etching regions of said conductive contact material and said semiconductor material not protected by said contact mask,
   wherein said selective etching process leaves said conductive contact material on source and drain regions of said first fin, and
   wherein said selective etching process removes source and drain regions of a second fin of said two longer fins.

2. The method in claim 1, wherein, after said selective etching process, said first fin is longer than said second fin.

3. The method in claim 1, wherein, after said selective etching process, said second fin has a length equal to a width of said gate conductor comprising a gate structure.

4. The method in claim 1, wherein, after said selective etching process, said source and drain regions of said first fin extend beyond said gate.

5. The method in claim 1, wherein, after said selective etching process, said second fin does not extend beyond said gate structure.

6. The method in claim 1, wherein said selective etching process forms source and drain contacts covering said source and drain regions of said first fin.

7. The method in claim 1, wherein, after said selective etching process, no contacts are positioned adjacent said second fin.

8. A method of manufacturing a fin-type field effect transistor (FinFET), said method comprising:
   forming at least two parallel fins on a substrate;
   patterning a gate conductor over central sections of said fins, wherein said gate conductor intersects to said fins;
   covering said gate conductor and said semiconductor material with a conductive contact material;
   forming a contact mask over a portion of said conductive contact material that is above source and drain regions of a first fin of said fins; and
   selectively etching regions of said conductive contact material and said semiconductor material not protected by said contact mask,
   wherein said selective etching process leaves said conductive contact material on source and drain regions of said first fin, and
   wherein said selective etching process removes source and drain regions of a second fin of said fins.

9. The method in claim 8, wherein, after said selective etching process, said first fin is longer than said second fin.

10. The method in claim 8, wherein, after said selective etching process, said second fin has a length equal to a width of said gate structure.

11. The method in claim 8, wherein, after said selective etching process, said source and drain regions of said first fin extend beyond said gate structure.

12. The method in claim 8, wherein, after said selective etching process, said second fin does not extend beyond said gate structure.

13. The method in claim 8, wherein said selective etching process forms source and drain contacts covering said source and drain regions of said first fin.

14. The method in claim 8, wherein, after said selective etching process, no contacts are positioned adjacent said second fin.

* * * * *